United States Patent
Jung et al.

(10) Patent No.: US 6,764,806 B2
(45) Date of Patent: Jul. 20, 2004

(54) OVER-COATING COMPOSITION FOR PHOTORESIST, AND PROCESSES FOR FORMING PHOTORESIST PATTERNS USING THE SAME

(75) Inventors: Jae Chang Jung, Kyoungki-do (KR); Keun Kyu Kong, Kyoungki-do (KR); Cha Won Koh, Seoul (KR); Jin Soo Kim, Taejeon-shi (KR); Ki Ho Baik, Kyoungki-do (KR)

(73) Assignee: Hyundai Electronics Industries Co., Ltd. (KR)

( * ) Notice: Subject to any disclaimer, the term of this patent is extended or adjusted under 35 U.S.C. 154(b) by 42 days.

(21) Appl. No.: 09/728,535

(22) Filed: Dec. 1, 2000

(65) Prior Publication Data

US 2001/0003030 A1 Jun. 7, 2001

(30) Foreign Application Priority Data

Dec. 2, 1999 (KR) .......................................... 99-54365

(51) Int. Cl.[7] ............................................... G03C 1/492
(52) U.S. Cl. .................... 430/273.1; 430/296; 430/325; 430/326; 430/311; 430/18; 430/967; 526/318.4; 524/94; 524/198; 524/252; 524/307; 524/316; 524/284; 524/365; 524/388
(58) Field of Search ........................ 430/296, 311–331, 430/18, 967, 273.1; 526/318.4; 524/94, 198, 252, 307, 316, 284, 365, 388

(56) References Cited

U.S. PATENT DOCUMENTS 4,003,870 A * 1/1977 Gibson et al. ......... 260/29.6 W
4,925,770 A    5/1990 Ichimura et al.
5,240,812 A    8/1993 Conley et al.
5,611,850 A * 3/1997 Nishi et al. ............. 106/287.26
5,744,537 A * 4/1998 Brunsvold et al. .......... 524/520
5,750,312 A    5/1998 Chandross et al. ...... 430/273.1
5,783,362 A * 7/1998 Wakiya et al. ............ 430/273.1
6,132,928 A * 10/2000 Tanabe et al. ........... 430/270.1
2003/0108815 A1 * 6/2003 Jung et al. ................ 430/273.1

FOREIGN PATENT DOCUMENTS

| EP | 1026208-a1 | * | 8/2000 |
| JP | 02-263811-a | * | 10/1990 |
| JP | 8-254833 | | 10/1996 |
| JP | 08-305022 | | 11/1996 |
| JP | 10-010743 | | 1/1998 |

OTHER PUBLICATIONS

Grant et al, eds., Grant and Hackh's Chemical Dictionary, fifth ed, McGraw–Hill Book Company, New York, N. Y. 1987, p. 24, "alkyl".*

Jung, J.–C. et al , "Amine gradient process for DUV lithography", Polymer 42(2001), pp. 161–165.*

Weast, Robert, ed, CRC:Handbook of Chemistry and Physics, 52nd ed, Chemical Rubber Co, Cleveland, Ohio, 1971, pp. F63–F64, F66, F90.*

(List continued on next page.)

Primary Examiner—Cynthia Hamilton
(74) Attorney, Agent, or Firm—Townsend and Townsend and Crew LLP

(57) ABSTRACT

The present invention provides an over-coating composition comprising a basic compound for coating a photoresist composition to provide a vertical photoresist pattern.

20 Claims, 4 Drawing Sheets

OTHER PUBLICATIONS

Grant et al, eds. Grant and Hackh's Chemical Dictionary Fifth ed, McGraw–Hill Book Company, New York, NY, 1987, pp. 32–33, 516.*

Tomihari et al, PTO 03–215, English translation of Japanese Kokai Patent Application No. Hei 2–263811 for the United States Patent and Trademark Office in Oct. 2002, translated by the Ralph McElroy Translation Company., 15 pages with coversheet.*

Morpholine (Internation Programme on Chemical Safety) Environmental Health Criteria 179), partial copy, first 23 pages obtained from sss.inchem.org/documents/ehc/ehc/ehc179, dated as published in 1996 by World Health Organization, Geneva 1996.*

Polymer, vol. 42, No. 1 (Jan.) 2001 (published Sep. 2000), the table of contents, 2 pages.* www.sciencedirect.com/science?__...10&md5= bc534c4d63b93087d9e698b9ff3d, "ScienceDirect—Polymer:Amine gradient process for DUV lithography", Polymer vol. 42, Issue 1, Jan. 2001, Abstract page, one page, Date marked available Sep. 7, 2000.*

U.S. patent application Ser. No. 10/174,497, Jung et al., filed Jun. 17, 2002.

* cited by examiner

OVER-COATING COMPOSITION FOR PHOTORESIST, AND PROCESSES FOR FORMING PHOTORESIST PATTERNS USING THE SAME

BACKGROUND OF THE INVENTION

1. Field of the Invention

The present invention relates to an over-coating composition and processes for forming a fine pattern using the same. In particular, the present invention relates to an over-coating composition comprising a basic compound, and methods for forming ultrafine (i.e., <150 nm) patterns using the same. The over-coating composition of the present invention is particularly suitable in a photolithography process using photoresist resins having a low light transmittance.

2. Description of the Background Art

In a photolithography process, an exposure of photoresist to light of a particular wavelength generates an acid from the photoacid generator present in the photoresist. The photo generated acid causes the main chain or the branched chain of the resin to decompose or become cross-linked. In addition, the acid removes the acid labile group and changes the polarity of the photoresist in the exposed region. This polarity change creates a solubility difference between the exposed portion and the unexposed portion in a developing solution, thereby allowing a pattern formation. The resolution of the pattern that is formed depends on the wavelength, i.e., in general, a shorter wavelength allows formation of more minute patterns.

Fine photoresist patterns of 150 nm L/S have successfully been developed using a light source which produces light having wavelength of 248 nm (KrF). Attempts at forming high quality fine circuit patterns smaller than 150 nm have thus far been relatively unsuccessful. These attempts have used light sources which generate short wavelengths such as ArF (193 nm), $F_2$ (157 nm) and EUV (13 nm) and have employed photoresist resins having a low transmittance to the short wavelengths, resulting in poor quality patterns. For example, a photoresist resin which has been used with i-line (365 nm) and KrF (248 nm) light sources contains aromatic compounds, which have a relatively high absorbance of 193 nm wavelength light. Photoresists comprising acrylic or alicyclic resins which do not contain aromatic compounds have also been synthesized and used; unfortunately, these resins also have a relatively high absorbance of 193 nm wavelength light.

Use of conventional chemically amplified photoresist resins having a low transmittance is undesirable because the low transmittance results in more light reaching the upper portion of the photoresist than the bottom portion, which results in higher acid concentration in the upper portion of the photoresist than in the bottom portion of the photoresist, which can result in a bulk slope profile pattern. See FIG. 1b. This is contrasted to a pattern formed when the photoresist resin has a relatively low light absorbance. In this case, the amount of light reaching the upper and bottom portions of the photoresist is nearly identical, thus forming a desired vertical pattern. See FIG. 1a.

In order to overcome the above disadvantages, efforts have been directed at synthesizing resins having a low light absorbance, in particular for light wavelengths of 157 nm ($F_2$) and 13 nm (EUV). Unfortunately, these attempts have proven unsuccessful as acids generated in the exposed area of the photoresists are neutralized by atmospheric amines during the time between the exposure and post exposure baking ("post exposure delay effect"). Since pattern formation depends on acids that are generated by the exposure, neutralization of acids by atmospheric amine compounds reduces, prevents or alters a pattern or the pattern may have a T-shape ("T-topping"). This problem is especially acute when the concentration of environmental amines is over 30 ppb, which can lead to no pattern formation.

SUMMARY OF THE INVENTION

Accordingly, an object of the present invention is to provide an over-coating composition containing a basic compound that can solve the above-mentioned problems.

Another object of the present invention is to provide a process for forming a photoresist pattern by using the above over-coating composition.

Still another object of the present invention is to provide a semiconductor device produced by using the above described over-coating composition.

DETAILED DESCRIPTION OF THE PREFERRED EMBODIMENTS

Figure 1A:
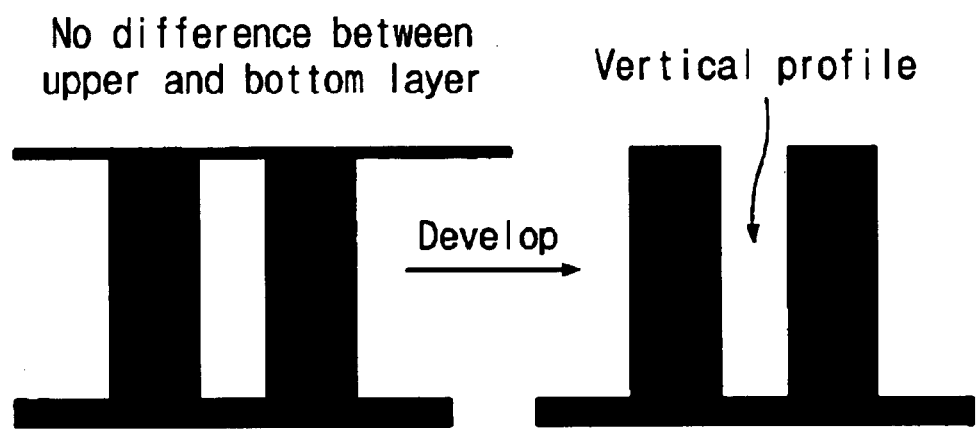
FIG. 1a shows a pattern profile obtained when the photoresist resin having little absorbance to a light source is used.

The present invention provides an over-coating composition comprising a basic compound, which achieves the above-stated objectives. The present invention also provides processes for forming a vertical photoresist pattern, even when a photoresist resin has a relatively high absorbance to light used in pattern formation.

In one particular aspect, the present invention provides an over-coating composition comprising an over-coating resin, a solvent, and a basic compound. The over-coating composition of the present invention is particularly useful in producing a vertical photoresist pattern by coating a photoresist composition prior to a photoresist pattern formation.

The over-coating resin of the present invention is preferably a water-soluble polymer. In one embodiment of the present invention, the over-coating resin is derived from a monomer selected from the group consisting of acrylic acid, alkyl acrylate, and mixtures thereof. Preferably, the over-coating resin is derived from a mixture of monomers comprising acrylic acid and alkyl acrylate. Preferably, alkyl acrylate is $C_1$–$C_6$ alkyl acrylate, more preferably unsubstituted $C_1$–$C_6$ alkyl acrylate, and most preferably methyl acrylate. Thus, a particularly useful over-coating resin includes poly(acrylic acid/methyl acrylate).

Preferably, the solvent in the over-coating composition is an aqueous solvent. A particularly preferred solvent for the over-coating composition is water.

Preferably, the basic compound in the over-coating composition is a water-soluble compound, including cyclic and acyclic compounds comprising at least one nitrogen atom (i.e., nitrogen-containing compound). Exemplary nitrogen-containing compounds which are useful in the present invention include amine compounds, such as amino acids; amide compounds; urethane compounds, such as urea; derivatives and salts thereof, and mixtures thereof.

Preferably, pKa of the conjugate acid of the basic compound (i.e., protonated basic compound) is about 13 or less, preferably about 11 or less, more preferably about 9 or less, and most preferably about 7 or less.

In one particular embodiment of the present invention, the basic compound is a compound of formula I:

where each of $R_1$, $R_2$ and $R_3$ is independently H or $C_1$–$C_{20}$ alkyl. Alkyl groups according to the present invention are aliphatic hydrocarbons which can be straight or branched chain groups. Alkyl groups optionally can be substituted with one or more substituents, such as a halogen, alkenyl, alkynyl, aryl, hydroxy, amino, thio, alkoxy, carboxy, oxo or cycloalkyl. There may be optionally inserted along the alkyl group one or more oxygen, sulfur or substituted or unsubstituted nitrogen atoms. Preferred alkyl groups include unsubstituted alkyl groups, and alkyl groups containing one or more substituents selected from the group consisting of hydroxy, amine, and carbonyl (such as ketone, carboxylic acid, and ester) groups. And more preferably, each alkyl group is independently selected from the group consisting of $C_1$–$C_{20}$ alkyl, $C_1$–$C_{20}$ hydroxyalkyl, $C_1$–$C_{20}$ alkyl carboxylic acid, $C_1$–$C_{20}$ alkylamine, $C_1$–$C_{20}$ alkylketone, and $C_1$–$C_{20}$ alkylester. As used herein, "hydroxyalkyl" refers to an alkyl group substituted with a hydroxy functional group. The term "alkyl carboxylic acid" refers to an alkyl group substituted with a carboxylic acid functional group. The term "alkylketone" refers to a moiety of the formula —Ra—C(=O)—Rb—, where Ra and Rb are alkyl groups defined above, preferably Ra and Rb are unsubstituted alkyl. And the term "alkyl ester" refers to an alkyl group substituted with an ester functional group.

In one aspect of the present invention, the basic compound is selected from the group consisting of an amino acid, tetraalkylammonium salt, tri(hydroxyalkyl)ammonium salt, and mixtures thereof. A particularly preferred amino acid includes L-proline. Preferred tetraalkylammonium salt includes tetramethylammonium hydroxide (TMAH) and tetramethylammonium hydroxide pentahydrate. And preferred tri(hydroxyalkyl)ammonium salt includes triethanolamine.

The amount of basic compound present in the over-coat composition of the present invention is preferably about 0.001 to about 0.1 mol %, and more preferably about 0.01 mol % relative to the solvent employed.

The amount of solvent used in preparation of the over-coat composition of the present invention is preferably in the range of from about 1000 to about 7000% by weight of the over-coating resin, and more preferably about 4000% by weight.

Figure 1B:
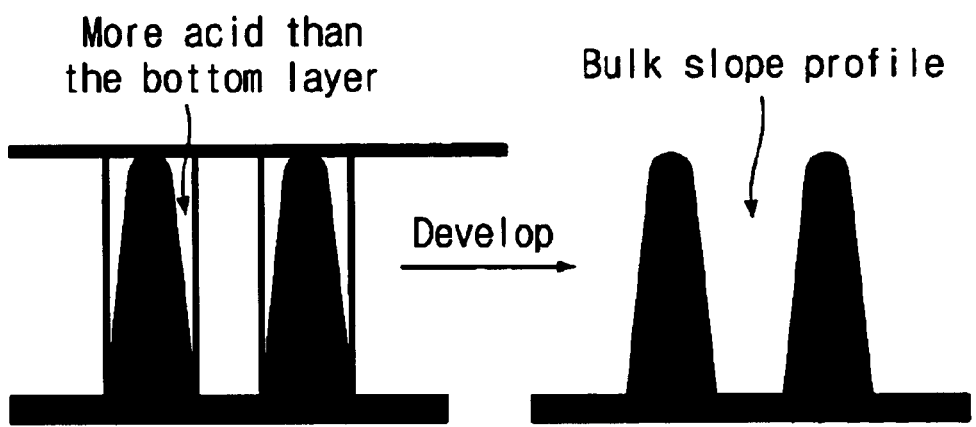
FIG. 1b shows a pattern profile obtained when the photoresist resin having much absorbance to a light source is used.

Without being bound by any theory, it is believed for a photoresist resin having a low transmittance, more acid is generated in the upper portion of the photoresist film than the bottom portion (see FIG. 1b). As used herein the term "low transmittance" means that the photoresist resin has a high absorbance of the wavelength such that most of the light is absorbed in the upper portion of the photoresist film and only a small amount of light penetrates down into the lower portion of the photoresist film. It is believed that the basic compound in the over-coating composition diffuses or penetrates into the photoresist film layer, and neutralizes at least a portion of the acids in the upper portion of the photoresist film, thereby providing a more uniform acid concentration throughout the photoresist film depth. For example, as the basic compound penetrates into the photoresist film, initially a large amount of basic compound is present in the upper portion of the photoresist film relative to the bottom portion of the photoresist film. Some of these basic compounds are neutralized by the acids that are generated by photolysis, thus there is a gradual decrease in the amount of basic compound diffusing further down towards the lower portion of the photoresist film. This results in a basic compound gradient along the depth of the photoresist film preventing or reducing the formation of a sloped photoresist pattern caused by a high light absorbance by the photoresist resin.

In addition, it is believed that the over-coating composition of the present invention reduces or prevents neutralization of acids generated during a photolysis by environmental amine compounds during the post exposure delay (i.e., PED), thereby reducing or preventing T-topping. Thus, the over-coating composition acts as a buffer to prevent the acid generated at the exposed area from being neutralized by the environmental amine compounds during PED. It is also believed that the basic compound in the over-coating composition of the present invention reduces or prevents acids that are generated during a photolysis from diffusing into an unexposed area of the photoresist film, thereby providing a superior photoresist pattern.

The present invention also provides a process for forming a photoresist pattern comprising the steps of:

(a) coating a photoresist composition on a substrate to form a photoresist film;

(b) coating the over-coating composition of the photoresist film to produce an over-coated substrate;

(c) exposing the over-coated substrate to light using a light source; and (d) developing the light exposed over-coated substrate.

The photoresist composition can comprise any currently known chemically amplified photoresist resin, including poly(tert-butyl bicyclo[2.2.1]hept-5-ene-2-carboxylate/2-hydroxyethyl bicyclo[2.2.1]hept-5-ene-2-carboxylate/bicyclo[2.2.1]hept-5-ene-2-carboxylic acid/maleic anhydride).

The process for producing the photoresist pattern can also comprise baking step(s) before and/or after exposing the over-coated substrate light. The baking step is typically performed at temperature of from about 10 to about 200° C.

Exemplary light sources which are useful for forming a photoresist pattern include ArF (193 nm), KrF (248 nm), $F_2$ (157 nm), EUV (13 nm), E-beam, X-ray and ion beam.

In another embodiment, the present invention also provides a semiconductor element that is manufactured using the over-coating composition described above.

The present invention will now be described in more detail by referring to the examples below, which are not intend to be limiting.

INVENTION EXAMPLE 1

Measurement of Absorbance

DHA1001 (a photoresist composition manufactured by Dong-jin Semichem Inc.) comprising poly(tert-butyl bicyclo[2.2.1]hept-5-ene-2-carboxylate/2-hydroxyethyl bicyclo[2.2.1]hept-5-ene-2-carboxylate/bicyclo[2.2.1]hept-5-ene-2-carboxylic acid/maleic anhydride) as a photoresist resin was coated on a quartz-wafer, baked at 150° C. for 90 seconds, and cooled to 23° C. (photoresist thickness: about 1 μm). Here, transmittance of the photoresist measured by JASCO VLJV 200 spectrometer was 45%.

COMPARATIVE EXAMPLE 1

At an environmental amine concentration of 1 ppb, the photoresist composition used in Invention Example 1 was coated on the wafer at a thickness of about 0.4 μm, baked at 150° C. for 90 seconds, and cooled to 23° C.

Figure 2:
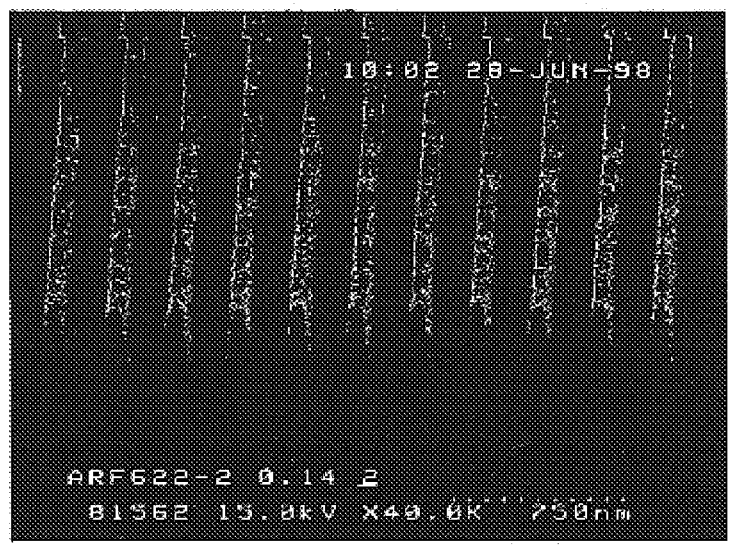
FIG. 2 shows a photoresist pattern obtained in Comparative Example 1.

Thereafter, the coated photoresist was exposed to light using an ArF exposer, baked at 140° C. for 90 seconds, and developed in 2.38 wt % TMAH solution to obtain a 140 nm L/S pattern. As shown in FIG. 2, the photoresist pattern was severely sloped due to the low transmittance of the photoresist composition.

COMPARATIVE EXAMPLE 2

The procedure of Comparative Example 1 was repeated, except the environmental amine concentration was 5 ppb instead of 1 ppb. A vertical pattern shown in FIG. 3 was obtained.

COMPARATIVE EXAMPLE 3

The procedure of Comparative Example 1 was repeated, except the environmental amine concentration was 40 ppb instead of 1 ppb. A photoresist pattern having a rounded upper portion shown in FIG. 4 was obtained.

Figure 3:
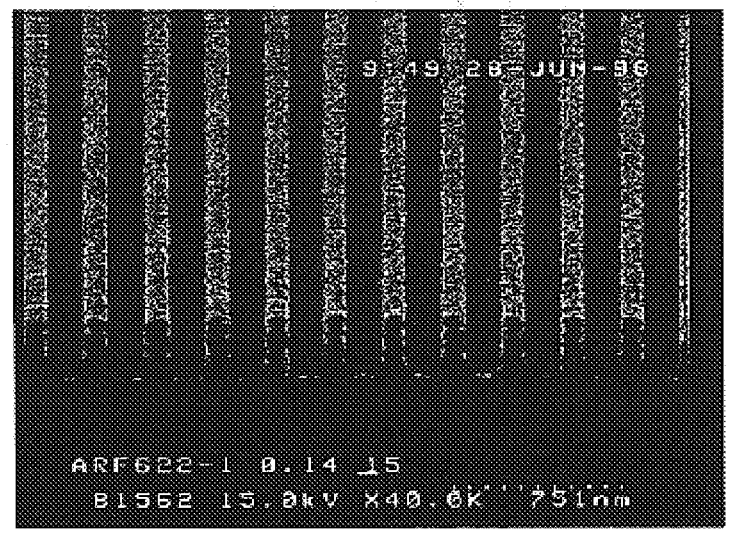
FIG. 3 shows a photoresist pattern obtained in Comparative Example 2.

As shown in the Comparative Examples 1 to 3, when the concentration of environmental amine is low, a relatively severely sloped photoresist pattern was obtained due to a low transmittance of the photoresist (see FIG. 2). As described above with reference to FIG. 1b, it is believed that this sloping photoresist pattern is due to the fact that the amount of light reaching the upper portion of the photoresist film is greater than the amount of light reaching the bottom portion of the photoresist film, which results in a higher amount acids generated in the upper portion of the photoresist film. But as can be seen in FIG. 3, a vertical photoresist pattern is formed when the concentration of environmental amine is increased from 1 ppb to 5 ppb. It is believed that this is because the environmental amine come in contact with and penetrates into the photoresist and neutralizes the acid in the upper portion of the photoresist film, while only a small amount of the environmental amine compound penetrates into the bottom portion of the photoresist film. Thus, when the amount of environmental amine present is high, the acid concentration gradient along the depth of the photoresist film, which is produced by a photolysis of photoresist composition having a high absorbance, is minimized by a similar environmental amine compound gradient along the depth of the photoresist film. This results in a vertical photoresist pattern as shown in FIG. 3.

Figure 4:
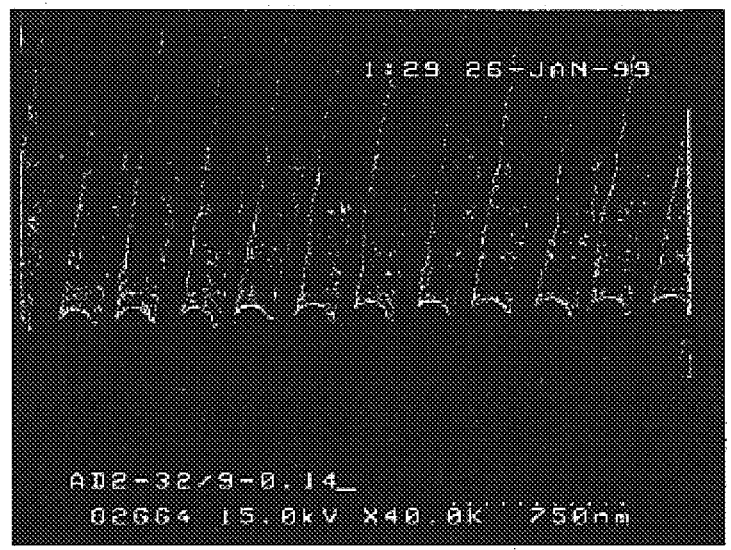
FIG. 4 shows a photoresist pattern obtained in Comparative Example 3.

However, when the concentration of the environmental amine compound is 40 ppb or more, the amount of environmental amine compound is significantly higher than the amount of acid that is typically generated during the photolysis resulting in a photoresist pattern having a swollen upper portion as shown in FIG. 4.

At the environmental amine concentration of 5 ppb, a high quality photoresist pattern was obtained using a low transmittance photoresist resin. Unfortunately, the environmental amine concentration can not be maintained constantly at 5 ppb throughout a semiconductor device fabrication process. Typically, the environmental amine concentration varies continuously during an actual semiconductor device fabrication process.

PREPARATION EXAMPLE

Synthesis of Over-Coating Resin 9 g of acrylic acid, 1 g of methyl acrylate, 50 g of isobutyl methyl ketone, 50 g of propylene glycol methyl ether acetate and 3.0 g of AIBN were combined and heated to about 67° C. for 3 hours under an inert atmosphere (e.g., nitrogen gas). The precipitated polymer was washed with ethyl ether and vacuum dried to obtain pure poly(acrylic acid/methyl acrylate) resin (weight average molecular weight: 7200, yield: 54%).

COMPARATIVE EXAMPLE 4

Preparation of Over-Coating Composition

To 200 g of distilled water was added 5 g of poly(acrylic acid/methyl acrylate) resin prepared in the Preparation Example. The resulting solution was filtered through 0.20 μm-filter to produce an over-coating composition.

INVENTION EXAMPLE 2

Synthesis of Over-Coating Composition Containing Basic Compound

To 200 g of distilled water was added 0.16 g of L-proline and 5 g of poly(acrylic acid/methyl acrylate). The resulting solution was filtered through 0.20 μm-filter to produce the over-coating composition of the present invention.

COMPARATIVE EXAMPLE 5

Figure 5:
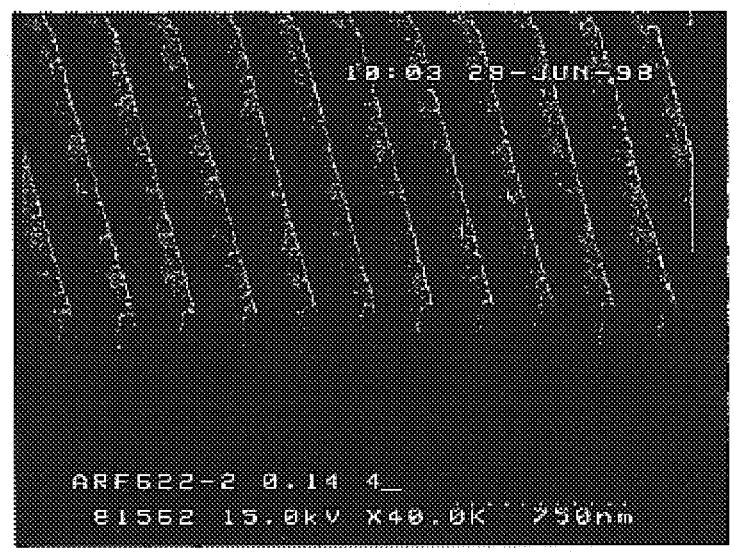
FIG. 5 shows a photoresist pattern obtained in Comparative Example 5.

DHA1001 photoresist composition used in Invention Example 1 was coated on a wafer, baked at 110° C. for 90 seconds, and cooled to 23° C. in an environmental amine concentration of 20 ppb. The over-coating composition of Comparative Example 4 which does not contain L-proline was coated on the photoresist film, baked at 60° C. for 60 seconds, and cooled. After baking, the wafer was exposed to light using an ArF laser exposer, and then post-baked at 110° C. for 90 seconds. When the post-baking was completed, it was developed in 2.38 wt % aqueous TMAH solution to obtain a 140 nm L/S pattern. As shown in FIG. 5, the photoresist pattern was sloped similar to those shown in FIG. 1b and FIG. 2. When the over-coating composition was not used (similar to Comparative Example 2) the vertical pattern was formed at the environmental amine concentration of 5 ppb. However, at the environmental amine concentration of 20 ppb, a relatively severely sloped photoresist pattern was formed even when an over-coating composition was used (see FIG. 5). Without being bound by any theory, it is believed that this sloping photoresist pattern is due to: (i) a high environmental amine concentration, (ii) absence of a basic compound in the over-coating composition which can neutralize acids in the upper portion of photoresist film, and/or (iii) the over-coating composition preventing the environmental amines from penetrating into the upper portion of photoresist film and neutralizing the acids.

INVENTION EXAMPLE 3

DHA1001 photoresist composition was coated on a wafer, baked at 110° C. for 90 seconds, and cooled to 23° C. in an environmental amine concentration of 20 ppb. Thereafter, the over-coating composition of Invention Example 2 containing L-proline was over-coated on the photoresist film, baked at 60° C. for 60 seconds, and cooled. After baking, the wafer was exposed to light using an ArF laser exposer, and then post-baked at 110° C. for 90 seconds. When the post-baking was completed, it was developed in 2.38 wt % aqueous TMAH solution to obtain a 140 nm L/S pattern (see FIG. 6).

Figure 6:
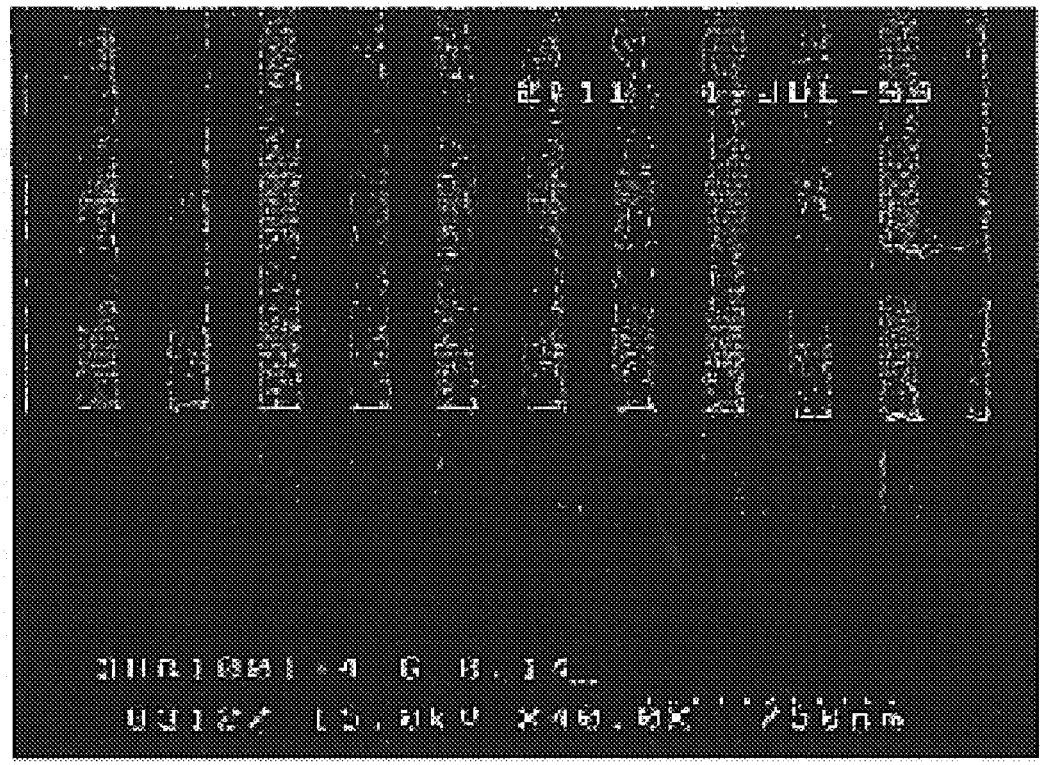
FIG. 6 shows a photoresist pattern obtained in Invention Example 3.

The pattern profile shown in FIG. 6 is vertical similar to that shown in FIG. 1a and FIG. 3. It is believed that L-proline in the over-coating composition penetrates into the photoresist film layer and neutralizes at least a portion of a large amount of acids that are generated in the upper portion of the photoresist, thereby preventing or significantly reducing the formation of a sloped photoresist pattern.

As shown above, when the over-coating composition of the present invention is used, it is believed that the basic compound in the over-coating composition penetrates into the photoresist film layer, thereby providing an amine gradient within the photoresist film. Accordingly, a relatively large amount of acid on the upper portion of the photoresist film is neutralized resulting in a vertical photoresist pattern even when the photoresist resin has a high light absorbance.

What is claimed is:

1. An over-coating composition for coating a photoresist composition to provide a vertical photoresist pattern, said over-coating composition comprising (a) an over-coating resin derived from poly(acrylic acid/methyl acrylate), (b) a solvent, and (c) a basic compound.

2. The over-coating composition according to claim 1, wherein said over-coating resin is a water-soluble polymer.

3. The over-coating composition according to claim 1, wherein pKa of the conjugate acid of said basic compound is about 13 or less.

4. The over-coating composition according to claim 1, wherein said basic compound is a nitrogen containing compound.

5. The over-coating composition according to claim 1, wherein said basic compound is selected from the group consisting of an amine compound and a hydroxide salt thereof; an amide compound; a urethane compound; and a mixture thereof.

6. The over-coating composition according to claim 5, wherein said amine compound is of the formula:

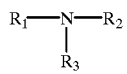

wherein each of $R_1$, $R_2$ and $R_3$ is independently H, or $C_1$–$C_{20}$ alkyl.

7. The over-coating composition according to claim 6, wherein said alkyl is selected from the group consisting of unsubstituted $C_1$–$C_{20}$ alkyl, $C_1$–$C_{20}$ hydroxyalkyl, $C_1$–$C_{20}$ alkyl carboxylic acid, $C_1$–$C_{20}$ aminoalkyl, $C_1$–$C_{20}$ alkylketone, and $C_1$–$C_{20}$ alkylester.

8. The over-coating composition according to claim 5, wherein said amine compound is selected from the group consisting of L-proline, a tetraalkylammonium hydroxide salt, a tri(hydroxyalkyl)amine, and a mixture thereof.

9. The over-coating composition according to claim 8, wherein said tetraalkylammonium hydroxide salt is selected from the group consisting of tetramethylammonium hydroxide and tetramethylammonium hydroxide pentahydrate.

10. The over-coating composition according to claim 8, wherein said tri(hydroxyalkyl)amine is triethanolamine.

11. The over-coating composition according to claim 1, wherein the amount of said basic compound is in the range from about 0.001 to about 0.1 mol % of said solvent.

12. The over-coating composition according to claim 1, wherein the amount of said solvent is in the range from about 1000 to about 7000% by weight of said over-coating resin.

13. A composition for over-coating a photoresist layer used in a photolithography process wherein exposure of the photoresist to light of a particular wavelength generates acid from a photoacid generator present in the photoresist, said over-coating composition comprising (a) an over-coating resin derived from a mixture of acrylic acid and an alkyl acrylate, (b) a solvent, and (c) a basic compound in an amount sufficient to diffuse into the underlying photoresist layer and neutralize at least a portion of the acid generated in the upper portion thereof.

14. The over-coating composition according to claim 13 wherein the amount of said basic compound is in the range from about 0.001 to about 0.1 mol % of said solvent.

15. A process for forming a photoresist pattern, comprising the steps of:

(a) coating a photoresist composition on a substrate to form a photoresist film;

(b) coating an over-coating composition of claim 1 on the upper portion of said photoresist film to form a over-coating;

(c) exposing said over-coated substrate to light using a light source; and (d) developing said exposed over-coated substrate.

16. The process according to claim 15, wherein said photoresist composition comprises a chemically amplified photoresist resin.

17. The process according to claim 16, wherein said chemically amplified photoresist resin is poly(tert-butyl bicyclo[2.2.1]hept-5-ene-2-carboxylate/2-hydroxyethyl bicyclo[2.2.1]hept-5-ene-2-carboxylate/bicyclo[2.2.1]hept-5-ene-2-carboxylic acid/maleic anhydride).

18. The process according to claim 15 further comprising a baking step before and/or after said exposure step (c).

19. The process according to claim 18, wherein said baking step is performed at a temperature range of from 10 to 200° C.

20. The process according to claim 15, wherein said light source is ArF, KrF, $F_2$, EUV, E-beam, X-ray or ion beam.

* * * * *